United States Patent
Kaneko

(10) Patent No.: US 8,216,919 B2
(45) Date of Patent: Jul. 10, 2012

(54) METHOD OF MANUFACTURING A SEMICONDUCTOR DEVICE AND SUBSTRATE CARRIER STRUCTURE

(75) Inventor: Yuichi Kaneko, Miyazaki (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 13/009,673

(22) Filed: Jan. 19, 2011

(65) Prior Publication Data

US 2011/0183496 A1 Jul. 28, 2011

(30) Foreign Application Priority Data

Jan. 26, 2010 (JP) ................................ 2010-014518

(51) Int. Cl.
*H01L 21/263* (2006.01)
(52) U.S. Cl. ................. 438/474; 257/E21.331; 206/710
(58) Field of Classification Search .......... 206/710–712; 257/E21.331; 438/473–475
See application file for complete search history.

(56) References Cited

U.S. PATENT DOCUMENTS

| | | | |
|---|---|---|---|
| 6,458,628 B1 * | 10/2002 | Distefano et al. | 438/126 |
| 6,475,432 B2 * | 11/2002 | Balmer | 422/22 |

FOREIGN PATENT DOCUMENTS

JP 2003-168731 A 6/2003

* cited by examiner

*Primary Examiner* — William D Coleman
*Assistant Examiner* — Daniel Shook
(74) *Attorney, Agent, or Firm* — Studebaker & Brackett PC; Donald R. Studebaker

(57) ABSTRACT

A substrate carrier structure includes a tray and a secondary electron absorbing material. The tray holds a semiconductor substrate having a first surface on which semiconductor device elements are formed. The secondary electron absorbing material is interposed between the tray and this first surface of the semiconductor substrate. When the semiconductor substrate is irradiated with charged particles to form lattice defects, the secondary electron absorbing material prevents unwanted trapping of secondary electrons emitted from the tray, and thereby reduces the variability of electrical characteristics of semiconductor device elements formed on the semiconductor substrate.

18 Claims, 5 Drawing Sheets

METHOD OF MANUFACTURING A SEMICONDUCTOR DEVICE AND SUBSTRATE CARRIER STRUCTURE

BACKGROUND OF THE INVENTION

1. Field of the Invention

The present invention relates to the irradiation, with charged particles, of a semiconductor substrate on which a semiconductor device is formed, to control the electrical characteristics of the semiconductor device.

2. Description of the Related Art

Power devices such as power metal-oxide-semiconductor field-effect transistors (MOSFETs) and insulated gate bipolar transistors (IGBTs) are typically formed on a semiconductor wafer. It is known that the response characteristics of these devices can be improved by irradiating the wafer with a high-energy beam of charged particles such as ions or electrons. Irradiation with charged particles produces lattice defects in the wafer. By functioning as carrier recombination centers, the lattice defects promote the recombination of electrons and holes, thereby shortening the mean carrier lifetime. Charged particle irradiation therefore enables control of the turn-off time of a power device, and improves other switching characteristics.

During irradiation by the charged particle beam, wafers are placed in a carrier device such as the tray disclosed by Urushima et al. in Japanese Patent Application Publication No. 2003-168731. Even when wafers are placed in trays of identical structure and irradiated with charged particle beams under identical conditions, however, wafer-to-wafer variations are found to occur in electrical characteristics such as the gate threshold voltage of power devices formed on the wafers. Such variations lead to lower production yields and higher device failure rates in the field.

SUMMARY OF THE INVENTION

An object of the present invention is to provide a substrate carrier structure (e.g., a wafer carrier structure) and a method of manufacturing a semiconductor device that can reduce substrate-to-substrate variations in electrical characteristics of semiconductor devices formed on the substrates.

The invention provides a substrate carrier structure including a tray and a secondary electron absorbing material. The tray holds a semiconductor substrate having a first surface on which semiconductor device elements are formed. The secondary electron absorbing material is interposed between an inner surface of the tray and the first surface of the semiconductor substrate.

The invention also provides a method of manufacturing a semiconductor device including the steps of placing a semiconductor substrate in the substrate carrier structure described above, and irradiating the semiconductor substrate with a charged particle beam directed onto a second surface of the semiconductor substrate opposite the first surface.

By absorbing secondary electrons emitted from the tray during the irradiation step, the secondary electron absorbing material reduces variations in electrical characteristics of semiconductor device elements fabricated on the semiconductor substrate.

DETAILED DESCRIPTION OF THE INVENTION

Figure 1:
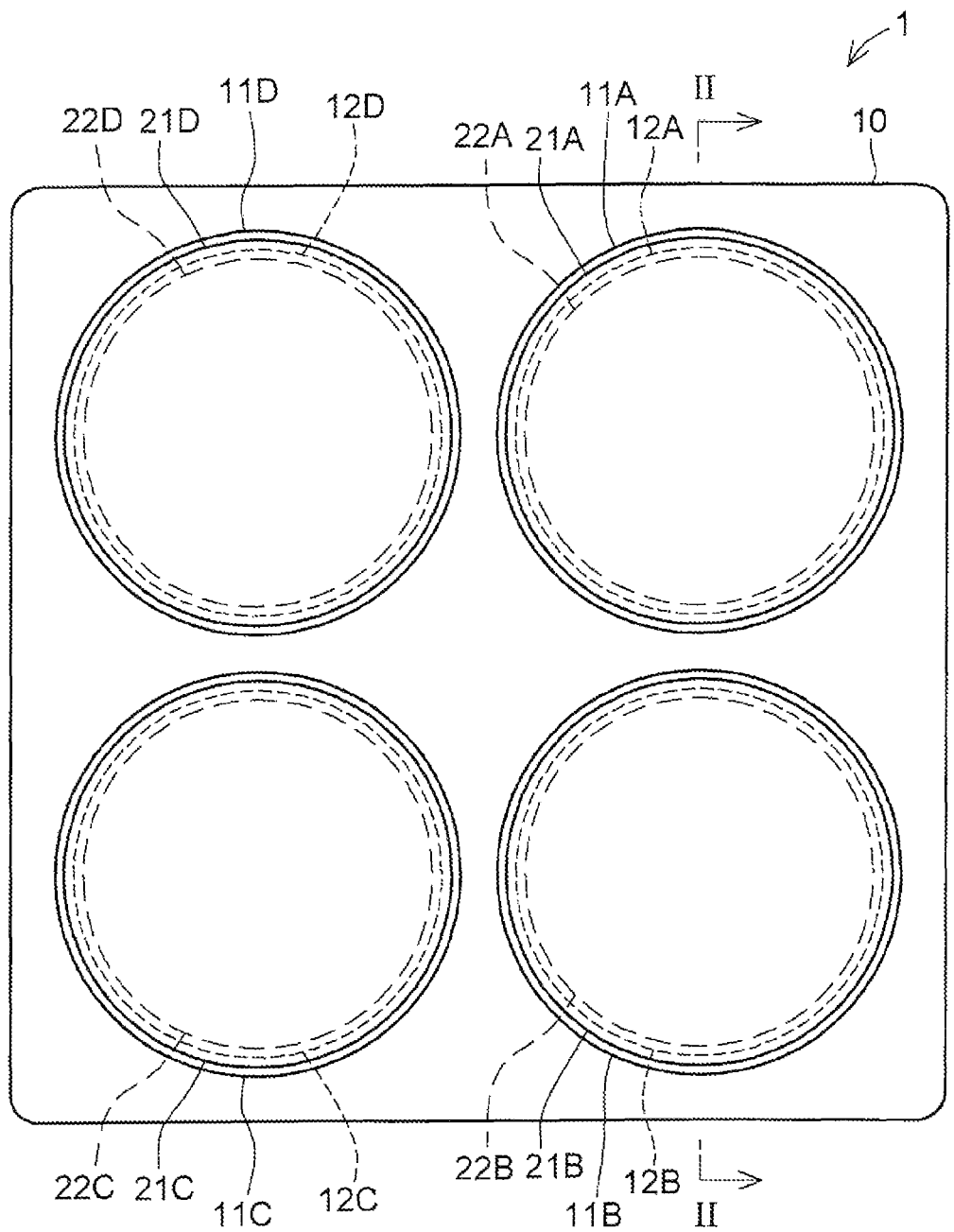
FIG. 1 is a schematic plan view of a substrate carrier structure according to an embodiment of the invention.

An embodiment of the invention will now be described with reference to the attached drawings, in which like elements are indicated by like reference characters.

Figure 2:
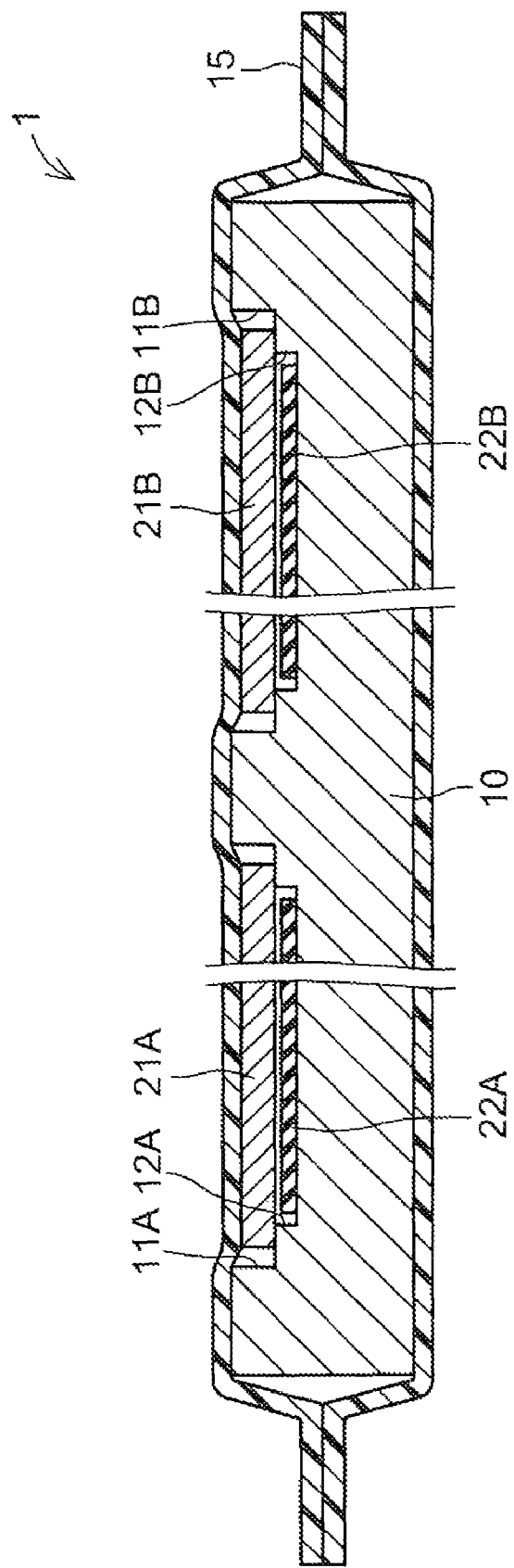
FIG. 2 is a sectional view through line II-II in FIG. 1.

The embodiment uses the substrate carrier structure 1 shown in plan view in FIG. 1 and in sectional view in FIG. 2. As seen in FIG. 2, the substrate carrier structure 1 is vacuum-packaged in a wrapping material 15 which is fashioned into a bag shape by, for example, thermal fusion bonding. The wrapping material 15 is omitted from FIG. 1 for visibility.

As shown in FIG. 1, the substrate carrier structure 1 includes a metal tray 10, four semiconductor wafers 21A, 21B, 21C, 21D, and protective sheets 22A, 22B, 22C, 22D including a secondary electron absorbing material. The tray 10 has recesses 12A, 12B, 12C, 12D in which the protective sheets 22A, 22B, 22C, 22D are placed, and wafer receptacles 11A, 11B, 11C, 11D that accommodate the four wafers 21A, 21B, 21C, 21D. As shown in FIG. 2, protective sheets 22A and 22B are placed on the flat floors of recesses 12A and 12B so that they are interposed between the tray 10 and respective wafers 21A and 21B. Protective sheets 22C and 22D are similarly placed on the floors of recesses 12C and 12D, interposed between an inner surface of the tray 10 and respective wafers 21C and 21D. Semiconductor device elements such as power MOSFETs or IGBTs are formed on the major surfaces of the wafers that face the protective sheets.

As shown in FIGS. 1 and 2, wafer receptacles 11A and 11B have an annular step structure that supports the circumferential edges of wafers 21A and 21B. The step height of this structure is preferably greater than the wafer thickness, so that the wafers 21A, 21B are completely accommodated within the receptacles 11A, 11B. Wafer receptacles 11C and 11D have a similar annular step structure that supports the circumferential edges of wafers 21C and 21D. The wafer receptacles 11A, 11B, 11C, 11D surround the recesses 12A, 12B, 12C, 12D. The tray 10 with the wafer receptacles 11A, 11B, 11C, 11D and recesses 12A, 12B, 12C, 12D may be made of a metal material such as aluminum.

The protective sheets 22A, 22B, 22C, 22D include sheets of a secondary electron absorbing material. The secondary electron absorbing material may be, for example, a polyethylene film, or a hot-rolled aluminum sheet or aluminum foil with a thickness in the range from about 0.005 mm to about 0.2 mm, preferably less than 0.02 mm.

When the surface of the substrate carrier structure 1 (the upper surface in FIG. 2) is irradiated with a charged particle beam such as an electron beam or ion beam having an energy high enough to penetrate through the wafers 21A, 21B, 21C, 21D, the incident charged particles produce lattice defects in the wafers 21A, 21B, 21C, 21D. These lattice defects create localized levels that function as carrier recombination centers in the forbidden band between the valence band and the conduction band.

Some of the charged particles, however, pass through the wafers 21A, 21B, 21C, 21D and protective sheets 22A, 22B, 22C, 22D and collide with atoms of the tray 10. Electrons excited by these collisions may escape from the atoms of the tray and be emitted as secondary electrons. The term 'secondary electrons' is used in this specification to refer specifically to such electrons emitted from the tray. Absent the protective sheets 22A, 22B, 22C, 22D, some of the secondary electrons emitted from the tray 10 would reenter the wafers 21A, 21B, 21C, 21D and become trapped in the localized levels, where they could give rise to wafer-to-wafer variations in electrical characteristics such as power MOSFET threshold voltages. In the present embodiment, however, the secondary electron absorbing material in the protective sheets 22A, 22B, 22C, 22D prevents the secondary electrons emitted from the substrate carrier structure 1 from reaching the wafers 21A, 21B, 21C, 21D, thereby suppressing wafer-to-wafer variations in electrical characteristics.

Next a method of using the substrate carrier structure 1 to manufacture semiconductor devices will be described with reference to FIGS. 3A to 3E.

Figure 3A:
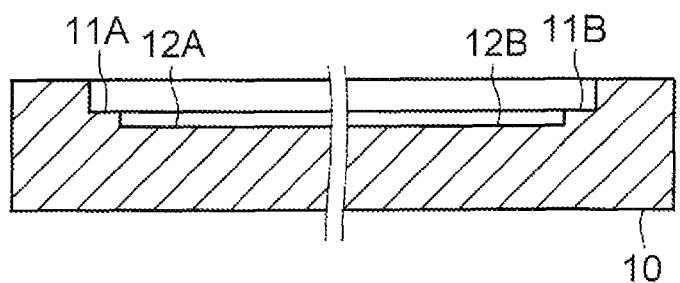
FIGS. 3A to 3E illustrate steps in a method of manufacturing a semiconductor device using the substrate carrier structure in FIGS. 1 and 2.
Figure 3B:
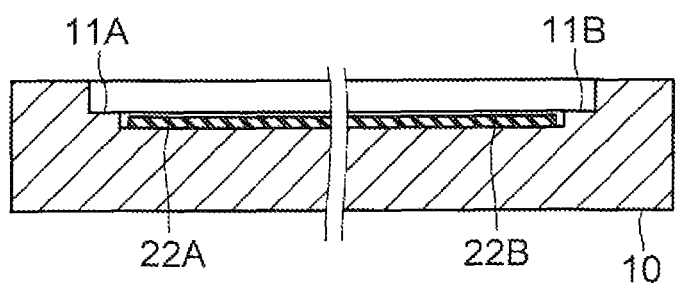

Starting from an empty tray 10 as shown in FIG. 3A, protective sheets 22A and 22B are first placed in recesses 12A and 12B as shown in FIG. 3B. Protective sheets 22C and 22D are similarly placed in recesses 12C and 12D (not shown). At this point the substrate carrier structure 1 includes only the tray 10 and the protective sheets 22A, 22B, 22C, 22D.

Figure 3C:
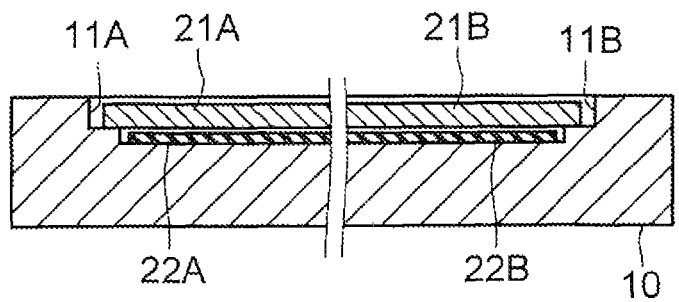
Figure 3D:
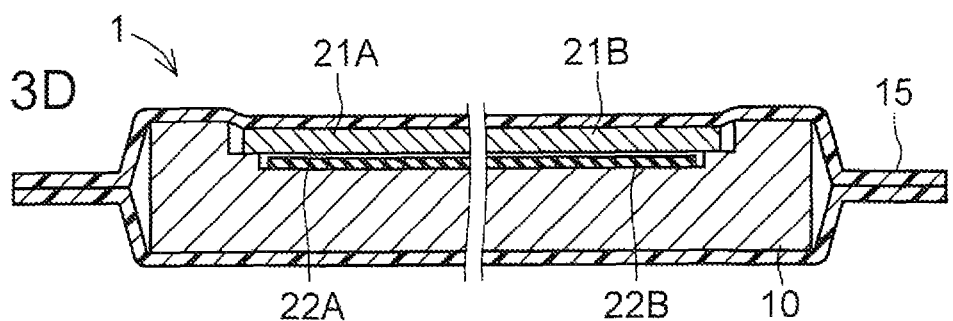

Next, wafers 21A and 21B are placed in wafer receptacles 11A and 11B so as to cover protective sheets 22A and 22B as shown in FIG. 3C. Wafers 21C and 21D are similarly placed in wafer receptacles 11C and 11D (not shown). The wafers 21A-21D are placed face down in the wafer receptacles 11A-11D, so that the wafer surfaces on which semiconductor device elements are formed face the upper surfaces of the protective sheets 22A-22D. The entire tray 10 is then vacuum packaged in the wrapping material 15, which is formed into a bag shape by thermal fusion bonding, as shown in FIG. 3D. At this point the substrate carrier structure 1 includes the tray 10, the protective sheets 22A-22D, the wafers 21A-21D, and the wrapping material 15.

Figure 3E:
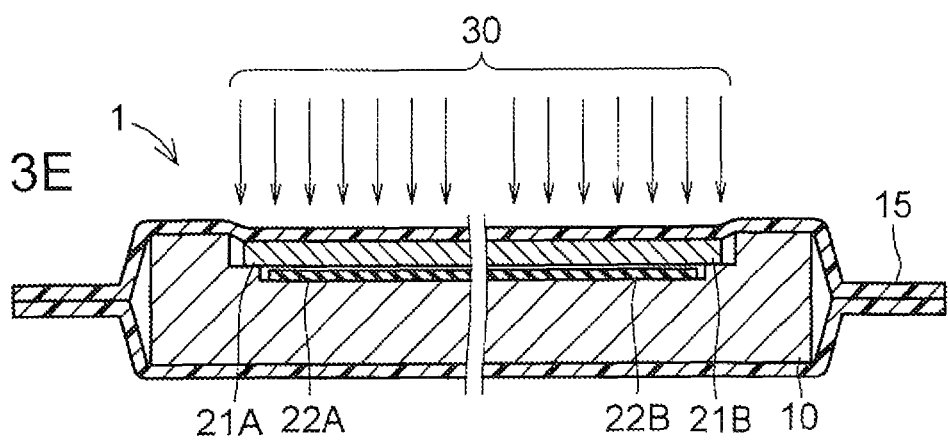
Figure 4A:
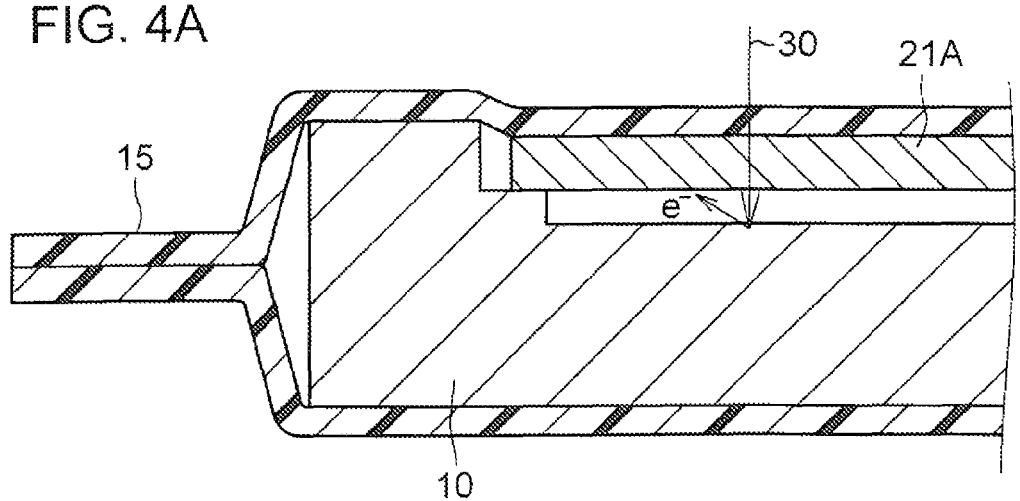
FIG. 4A is a partial sectional view of a substrate carrier structure lacking a protective sheet.
Figure 4B:
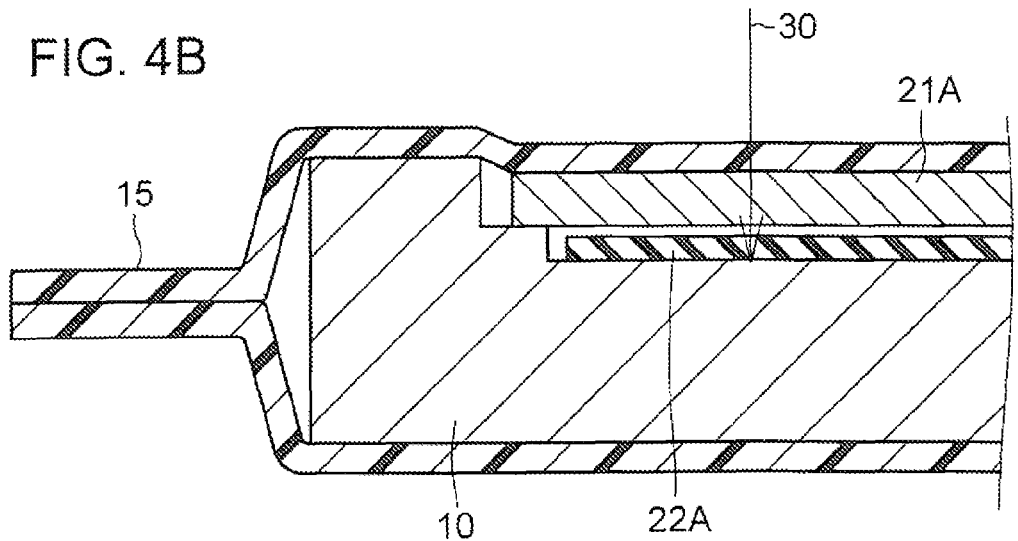
FIG. 4B is a partial sectional view of a substrate carrier structure including a protective sheet.

A known particle beam irradiation device (not shown) is now used to irradiate the surface of the substrate carrier structure 1 with a charged particle beam 30 as shown in FIG. 3E. The beam energy, which is determined by the particle acceleration voltage, should be high enough that the charged particles reliably penetrate the wafers 21A-21D and form lattice defects therein. After passing through the wafers 21A-21D, the charged particle beam 30 excites electrons in the atoms of the tray 10, which thus emits secondary electrons. Without the protective sheets 22A-22D, some of the secondary electrons ($e^-$) emitted from the tray 10 would reenter one or another of the wafers, e.g., wafer 21A as shown in FIG. 4A. In the present embodiment, however, the secondary electron absorbing material in the protective sheets 22A-22D prevents the secondary electrons from reaching the wafers 21A-21D, as indicated schematically in FIG. 4B.

After irradiation with the charged particle beam 30, the wrapping material 15 is removed. The wafers 21A-21D are then taken from the tray 10, transferred to an annealing oven (not shown), and annealed to stabilize the carrier recombination centers. After the annealing process, further processes may be carried out depending on the type of semiconductor device elements formed on the wafers. In the manufacture of power MOSFETs and IGBTs, for example, a grinding process may be carried out on the back surfaces of the wafers 21A-21D (the major surfaces on which no semiconductor device elements are formed) to reduce the wafer thickness, followed by formation of electrode structures on the back surfaces. Finally the wafers 21A-21D are diced into semiconductor chips.

In a variation of this manufacturing method, the back grinding process is carried out before the wafers are annealed.

As described above, the protective sheets 22A-22D prevent secondary electrons from reaching the wafers 21A-21D, thereby reducing variations in electrical characteristics of the semiconductor device elements formed on the wafers. In addition, when the tray 10 is vacuum packaged in the wrapping material 15, the protective sheets 22A-22D prevent the wafers 21A-21D from being damaged by being pressed against the tray 10.

The semiconductor device elements are formed on the wafers in a clean room. The purpose of the wrapping material 15 is to prevent contamination of the wafers 21A-21D while they are being transported from the clean room to the charged particle beam irradiation device, and when the wafers are mounted in the charged particle beam irradiation device. If a sufficiently clean environment is maintained on the transport route and in the charged particle beam irradiation device, the wrapping material 15 may be omitted.

Figure 5:
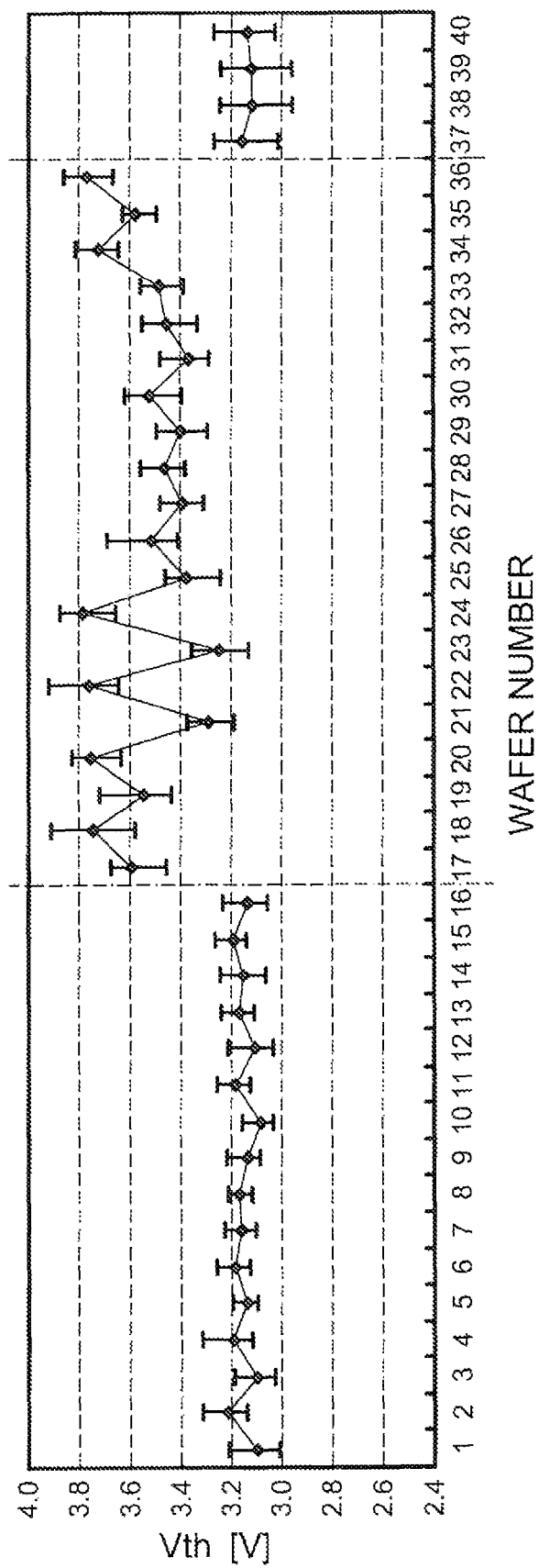
FIG. 5 is a graph showing results of measurements of threshold voltages of MOSFETs manufactured using the substrate carrier structures in FIGS. 4A and 4B.

Electrical characteristics of semiconductor device elements manufactured using the novel substrate carrier structure 1 and a comparative substrate carrier structure lacking the protective sheets 22A, 22B, 22C, 22D were measured to test the effect of the invention. Forty wafers were tested, of which wafers #1 to #16 and #37 to #40 were irradiated in the novel substrate carrier structure 1 and wafers #17 to #36 were irradiated in the comparative substrate carrier structure. Each wafer was diced into one thousand chips, each chip including several MOSFETs connected in parallel. Nine chips were selected from each wafer and their threshold voltages were measured. FIG. 5 shows the maximum, minimum, and average threshold voltages of the nine chips selected from each wafer. Threshold voltage is indicated in volts on the vertical axis and wafer number is indicated on the horizontal axis.

All forty wafers were irradiated by an electron beam with an acceleration voltage of 2 MeV and an absorbed radiation dose of 400 kGy, using an aluminum tray 10 with the structure shown in FIGS. 1 and 2. For wafers #1 to #16, the substrate carrier structure 1 also included protective sheets 22A-22D of dustless paper about 0.2 mm thick coated with polyethylene. For wafers #37 to #40, the protective sheets 22A-22D were sheets of a commercially available aluminum foil complying with the Japanese Industrial Standards (JIS). For wafers #17 to #36, the protective sheets 22A-22D were removed but all other conditions remained the same.

As FIG. 5 shows, there was considerable variation in threshold voltage Vth among wafers #17 to #36. The variation is thought to be due to the trapping of secondary electrons in localized levels in the gate oxide films of the MOSFETs. The variation in threshold voltage Vth was much less in wafers #1 to #16 and #37 to #40, because the secondary electrons were blocked by the protective sheets 22A-22D. The small amount of variation indicates that the blocking was effective.

It will be appreciated that the invention is applicable to the irradiation not only of power devices but also of thyristors, diodes, and in general any type of semiconductor device element having characteristics that may be affected by secondary electrons during wafer irradiation.

The tray need not be made of a metal such as aluminum. The invention is applicable to any type of tray that can emit secondary electrons.

The tray may accommodate any number of wafers. Depending on the tray size and wafer size, the tray may accommodate more than four wafers or fewer than four wafers.

The charged particle irradiation device is not limited to an electron beam device. The wafers may instead be irradiated with protons, helium ions, or any type of charged particles that can produce lattice defects in the wafers.

The choice of secondary electron absorbing materials is not limited to polyethylene and aluminum. Any type of material capable of absorbing secondary electrons may be used.

Those skilled in the art will recognize that further variations are possible within the scope of the invention, which is defined in the appended claims.

What is claimed is:

1. A method of manufacturing a semiconductor device, comprising:
    placing a secondary electron absorbing material in a tray;
    placing in the tray a semiconductor substrate having a first surface on which semiconductor device elements are formed, the semiconductor substrate being placed over the secondary electron absorbing material, and the first surface facing the secondary electron absorbing material; and
    forming lattice defects in the semiconductor substrate by irradiating a second surface of the semiconductor substrate with a charged particle beam, the second surface being positioned opposite to the first surface.

2. A semiconductor substrate carrier structure comprising:
    a tray for holding a semiconductor substrate having a first surface on which semiconductor device elements are formed; and
    a secondary electron absorbing material placed in the tray so as to be interposed between an inner surface of the tray and the semiconductor substrate;
    the semiconductor substrate being placed in the tray with the first surface facing the secondary electron absorbing material.

3. The method of claim 1, wherein the tray includes a recess accommodating the secondary electron absorbing material, and an outer portion surrounding the recess and supporting the semiconductor substrate.

4. The method of claim 1, wherein the secondary electron absorbing material includes polyethylene.

5. The method of claim 1, wherein the secondary electron absorbing material includes aluminum.

6. The method of claim 1, wherein the charged particle beam is an electron beam.

7. The method of claim 1, further comprising annealing the semiconductor substrate after irradiating the second surface of the semiconductor substrate with the charged particle beam.

8. The method of claim 1, wherein the secondary electron absorbing material forms at least part of a protective sheet that protects the first surface of the semiconductor substrate from contact with the tray.

9. The semiconductor substrate carrier structure of claim 2, wherein the tray includes a recess for holding the secondary electron absorbing material, and an outer portion surrounding the recess and supporting the semiconductor substrate.

10. The semiconductor substrate carrier structure of claim 2, wherein the secondary electron absorbing material includes polyethylene.

11. The semiconductor substrate carrier structure of claim 2, wherein the secondary electron absorbing material includes aluminum.

12. The semiconductor substrate carrier structure of claim 2, wherein the secondary electron absorbing material forms at least part of a protective sheet that protects the first surface of the semiconductor substrate from contact with the tray.

13. The semiconductor substrate carrier structure of claim 2, further comprising a wrapping material forming a vacuum package enclosing the tray together with the secondary electron absorbing material and the semiconductor substrate, the semiconductor substrate being held in the tray.

14. The semiconductor substrate carrier structure of claim 10, wherein the secondary electron absorbing material comprises dustless paper coated with the polyethylene.

15. The semiconductor substrate carrier structure of claim 11, wherein the secondary electron absorbing material is aluminum foil.

16. The semiconductor substrate carrier structure of claim 15, wherein the aluminum foil is at least 0.005 mm thick.

17. The semiconductor substrate carrier structure of claim 16, wherein the aluminum foil is at most 0.2 mm thick.

18. The semiconductor substrate carrier structure of claim 16, wherein the aluminum foil is at most 0.02 mm thick.

* * * * *